United States Patent [19]
Kim et al.

[11] Patent Number: 5,334,346
[45] Date of Patent: Aug. 2, 1994

[54] COPPER ALLOYS FOR ELECTRICAL AND ELECTRONIC PARTS

[75] Inventors: Young G. Kim, 247-17 Nonhyun-dong, Kangnam-ku, Seoul; In Y. Hwang, Ulsan-si, both of Rep. of Korea

[73] Assignees: Poongsan Corporation, Inchon; Young G. Kim, Seoul, both of Rep. of Korea

[21] Appl. No.: 19,363

[22] Filed: Feb. 18, 1993

[30] Foreign Application Priority Data

Sep. 24, 1992 [KR] Rep. of Korea ............... 17424/1992

[51] Int. Cl.$^5$ ................................................ C22C 9/00
[52] U.S. Cl. .................... 420/4.85; 420/487; 420/494; 420/499
[58] Field of Search ............... 420/485, 487, 494, 499

[56] References Cited

U.S. PATENT DOCUMENTS

| | | | |
|---|---|---|---|
| 3,522,039 | 7/1970 | McLain | 75/157.5 |
| 4,466,939 | 8/1984 | Kim et al. | 420/485 |
| 4,594,221 | 6/1986 | Caron et al. | 420/485 |
| 4,728,372 | 3/1988 | Caron et al. | 148/414 |
| 5,248,351 | 9/1993 | Kubozono et al. | 148/414 |

*Primary Examiner*—Upendra Roy
*Attorney, Agent, or Firm*—Armstrong, Westerman, Hattori, McLeland & Naughton

[57] ABSTRACT

This invention relates to a high performance copper alloy and its manufacturing methods for electrical and electronic parts which have good electrical conductivity, superior mechanical properties, and high thermal stability of tin-lead plating. The copper alloy consisting essentially of copper and from copper-nickel-silicon-phosphor-magnesium alloys for semiconductor lead-frame alloys consisting essentially of copper and from 0.5 to 2.4% by weight nickel, from 0.1 to 0.5% by weight silicon, from 0.02 to 0.16% by weight phosphorus, and from 0.02 to 0.2% by weight magnesium.

5 Claims, 4 Drawing Sheets

COPPER ALLOYS FOR ELECTRICAL AND ELECTRONIC PARTS

BACKGROUND OF THE INVENTION

This invention is concerned with high performance copper alloy and its manufacturing methods for electrical and electronic parts such as leadframe or connector materials which have good electrical(thermal) conductivity, superior mechanical properties, and high thermal stability of tin-lead plating. Copper-base alloys are widely used for electrical and electronic structural parts requiring high electrical conductivity and mechanical strength such as semiconductor leadframe and high strength electric materials such as connectors. Informations of general properties of semiconductor leadframe design and materials are described detailed in a book *Microelectronics Packaging Handbook* ed. by R. Tummala, Van Nostrand, 1989 New York, and in a Product Application Report of DESIGNING AND ADVANCED COPPER-ALLOY LEADFRAME MATERIAL by Y.G. Kim in *SEMICONDUCTOR INTERNATIONAL* April 1985, A CHANERS PUBLICATION, Denver, Colo. 80206. Leadframe is the backbone of a molded IC packaging. Fabricated by stamping a strip of sheet metal or by chemical etching, it serves as a holding fixture during the assembly process, then after molding, becomes a part of the IC package. After the molding process, legs of leadframe are electroplated by tin/lead for solderability and surface stability. Nowdays, the thermal stability of plated parts is becoming increasingly important, for some section of current semiconductor parts is used at high temperature at above 100° C. Therefore, during their uses at elevated temperatures, it is required to minimize any harmful interfacial reactions between the copper-base alloy and the electroplated tin/lead layer. When brittle intermetallic phases are formed at the interface between base metal and plating, the coated layer can be peeled off from the base metals or the coated layer can be cracked during with increasing temperature due to the increased diffusion of metallic elements to the interface. So the thermal stability of coated layer becomes important and it is a critical parameter in a selection of material. For a given coating material, formation of harmful intermetallic phases at the interface depend on chemical composition (alloying elements) in the base copper alloy matrix. Although the formation of the brittle intermetallic phases are mainly controlled by the diffusion of the alloying elements, it will be accelerated if the amount of the residual stress induced by the cold rolling is high. Therefore, it is necessary to remove or minimize the amount of residual stress by thermal annealing after the final rolling step.

It is required for semiconductor leadframe or connector materials to have high electrical and thermal conductivity, high thermal softening resistance, good electroplatability and good solderability. Specially, because of the automation of semiconductor packaging process, the need of high strength is increasing. But, generally, as the strength of material increase, the electrical conductivity and its elongation go down. High electrical conductivity is important to increase the rate of heat dissipation when the chip works. The ability of heat dissipation from the chip to the printed circuit board depends on the thermal conductivity of leadframe materials. The high tensile elongation is also required both to increase formability and to improve the resistance to the lead bend fatigue failure.

In conventional semiconductor leadframe materials, there are Cu-base alloys and Fe-base alloy to gain these properties. In Cu-base alloys, there are CDA 19400 (U.S. Pat. No. 3,522,039) and CDA 19500 invented by U.S. OLIN Company, and Cu-Ni-Si-P alloys (U.S. Pat. No. 4,466,939) by Poongsan Corp. In Korea etc.

CDA 19400 has the inferior strength properties than the alloy of U.S. Pat. No. 4,466,939. CDA 19500 has inferior elongation, and is also expensive because it contains the 0.8% cobalt of high price element. In the Fe-base alloy, Fe-42Ni alloy is being used. This alloy has high-strength, but has the inferior heat dissipation property because electrical conductivity is IACS 2-3% which is 1/20 of that of the copper-base alloys. And, other copper-base alloys available have been patented, such as U.S. Pat. No. 4,594,221 and U.S. Pat. No. 4,728,372. However, the multipurpose copper alloys covered by those alloys fails to meet the desired goals of high tensile strength, good electrical (thermal) conductivity, good thermal stability of Sn/Pb plating, and good elongation. Therefore, it is highly desirable to have new leadframe alloys having a tensile strength of about 80 ksi (57kg/mm) while maintaining an electrical conductivity of about 55% IACS or higher, and tensile elongation of about 6% or higher, while exhibiting thermal stability for the tin/lead coating at elevated temperature exposure. And, thermal softening resistance exceeding the temperature of 400° C. is required in the developing new Bare Bonding Technology which is an innovative processing method of Semiconductor IC packaging (Si chips are directly bonded to the Cu-leadframe without silver plating, and Cu-wire is used instead of gold wire). Thus, the mechanical properties which have high strength both at ambient and elevated temperature is required. And high elongation with a good electrical (thermal) conductivity is also desired for the new surface mounting technology. In the surface mounting technology, lead configurations require multiple bending. When the elongation is not high enough, crackings at the bend radii occur. Although the tensile strength of conventional copper alloys is lower than the of Fe-42Ni alloys, the copper alloy leadframes are widely used for plastic molded IC packaging because of its significantly higher electrical conductivity, compared with that of the Fe-42Ni alloy.

The inventor of the present invention obtained British Pat. No. 2,158,095, Japanese Pat. No. 1,426,889, and Korean Pat. No. 18,126 for the corresponding U.S. Pat. No. 4,466,939. The alloy of U.S. Pat. No. 4,466,939 comprised of 0.05-3.0% by weight nickel, 0.01-1.0% by weight silicon and 0.01-0.1% by weight phosphorus with balanced copper. The alloy satisfied the desired requirements for mechanical and physical properties specified in this invention, which is being now used commercially in semiconductor industries for good service at ambient temperature after the tin/lead plating on the legs of leadframe. The U.S. Pat. No. 4,466,939 is strengthened by precipitation hardening and cold work hardening during the thermomechanical processing. The precipitates formed were $Ni_2Si$ and $Ni_3P$ in the coppermatrix. It is ideal to have the exact amount of nickel, silicon and phosphorus in the copper matrix. However, if there exist any excess amount of silicon or phosphorus in the matrix, it will be present as free silicon or phosphorus in the matrix after forming $Ni_2Si$ and $Ni_3P$ precipitates. Then, the free silicon and phosphorus will diffuse out to the interface between the copper alloy matrix and the tin or Sn/Pb plated layer. At elevated temperature exposure, the diffusion will be accelerated, and then the formation of brittle intermetallic compounds comprising silicon, phosphorus, tin and lead can occur at the interface.

Therefore, the tin or the tin/lead layer can be peeled off from the copper-matrix, and cracking at the bent region could occur. Furthermore, the separation or peeling off the coated layer from the base matrix can also be affected by the residual stresses induced by the final cold rolling during the manufacturing stress by annealing heat treatment. In order to maintain the thermal stability of the tin/lead coated layer for the copper leadframe alloys, the presences of free silicon and phosphorus in the copper matrix should be avoided to prevent the formation of intermetallic compounds at the interface. To eliminate this problem, exact stoichiometric ratio of nickel, silicon and phosphorus is required, but it is practically impossible in commercial melting and casting stages. In other words, there are always some loss of alloying elements, therefore it is almost impossible to have an exact amount of the desired stoichiometric ratio.

SUMMARY OF THE INVENTION

It is therefore, this invention is proposed to reinforce prior art by adding another elements to the base alloy. It is aimed to improve mechanical properties, thermal stability of tin-lead plating while not to deteriorate electrical conductivity. It is achieved by adding other reactive element which can combine with free silicon and phosphorus left over after the formations of precipitates on $Ni_2Si$ and $Ni_3P$ in the copper matrix.

BRIEF DESCRIPTION OF THE DRAWINGS

The above and other object, feature and other advantages of the present invention will be more clearly understood from the following detailed description taken in conjunction with the accompanying drawings, in which.

DETAILED DESCRIPTION OF THE PREFERRED EMBODIMENTS

Figure 1:
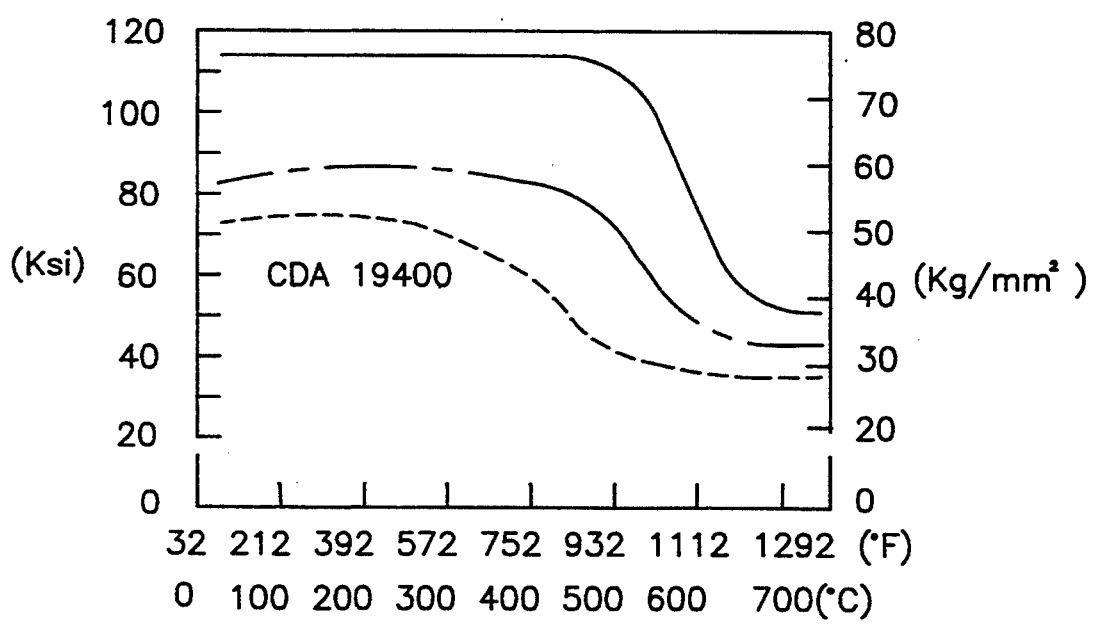
FIG. 1 is the graph which shows the thermal softening resistance property.

It is copper alloys of electric and electronic parts composed of 0.5–2.4w/o Ni, 0.1–0.5w/o Si, 0.02–0.16-w/o P, 0.02–0.2w/o Mg and copper balanced. It can also contain zinc below 1% by weight which acts as deoxidizing elements during melting and refining processes. And it can also contain iron below 1% by weight in substitution with the portion of nickel.

In this invention, in order to maintain thermal stability of the tin/lead coated layer for the copper leadframe alloys, the presences of free silicon and phosphorus in the copper matrix should be minimized to prevent the formation of intermetallic compounds at the interface.

In other words, by adding magnesium element which can combine with free silicon and phosphorus after the formation of precipitates in copper-matrix, the formation of brittle intermetallic compounds is prevented when tin-lead plated alloys are exposed at elevated temperatures. However, the adding alloying element should not deteriorate the desired mechanical and physical properties in this invention, especially the electrical conductivity (below 55% IACS) and the tensile elongation for good formability (below 6%). At the same time, the alloying element should tie up with all free silicon and phosphorus residing in the copper-matrix for thermal stability of the tin/lead coated layer. The major strengthening precipitate in this invention were $Ni_2Si$ and $Ni_3P$. Therefore, it was necessary to have the exact atomic ratio of nickel to silicon as 2:1 and the exact atomic ratio of nickel to phosphorus as 3:1 to minimize any free silicon or phosphor present in the copper matrix in the U.S. Pat. No. 4,466,939.

However, in actual commercial melting and casting process, it is almost impossible to have the exact amount of the stoichiometric ratio of the nickel to silicon and nickel to phosphorus. Therefore, the presence of any silicon or phosphorus in the matrix will be deleterious to electrical conductivity. The maximum upper limit of the nickel content is this inventions limited below 2.4 weight percent to insure the electrical conductivity more than IACS 55%. The upper limits of silicon and phosphorus in this inventions of copper-base alloy are 0.5% by weight and 0.16% by weight, respectively. The addition of phosphorus to the alloy has double roles as both a deoxidizing element and precipitation hardening element, and therefore it is added as copper-15% phosphorus mother alloy in copper alloy melting. Phosphorus is also forming a stable $Ni_3P$ precipitate upon aging as reported in the paper by the inventor of this alloy. (J. of Materials Science, Vol. 21 1986, pp. 1357–1362). Furthermore, a critical amount of magnesium below 0.2 percent by weight is required to provide the thermal stability of tin/lead electroplated coating on the copper alloy substrate at elevated temperature exposure by combining with any free silicon or phosphorus remaining in the copper-matrix.

Since magnesium is reactive with silicon and phosphorus, it will from the compounds of $Mg_2Si$, $Mg_3P_2$ or $Mg\,P_4$, eliminating any free silicon and phosphorus in the copper-matrix. However, too much addition of magnesium is not beneficial for having good electrical conductivity and ductility of the copper alloy. Therefore, magnesium content is confined to below 0.2 weight percent. Zinc can be added to the copper alloy up to 1 percent by weight since it does not degrade greatly the electrical conductivity of copper. Also zinc acts as a deoxidizing element in melting and refining stage of copper alloys. Adding iron, $Fe_3P$ precipitates are formed, then electrical conductivity may increase. Therefore, we can add iron below 1 percent by weight in substitution with nickel. For a given alloy composition, it is required to remove or minimize any residual stress imposed by the final cold rolling process for the further improvement of the thermal stability of the coated tin/lead layer. Therefore, tension-annealing heat treatments or tension levelling(repeated tension and compression bending treatments of the finally colded rolled sheets) are performed to improve thermal stability.

The manufacturing process of this invention are as follows. The process of this copper alloy comprises the steps of economically melting and casting these elements into the copper base alloy, where the alloy is hot rolled at a temperature of between 750°–950° C.; rapidly cooled, and cold rolled the sheet to reduction of between about 60 to 80%; intermediate annealing the resultant product at a temperature of between about 450° C. to about 520° C. for about half to two hours; air cooling the resultant product; cold rolling the resultant product with a thickness reduction of between about 50 to about 70% , annealing the resultant product at a temperature of between about 400° C. to about 550° C. for about half to two hours; air cooling the resultant product; cold rolling the resultant product with a thickness reduction of between about 30% to about 70%; an intermediate temperature annealing the resultant product at temperature of between about 300° and 500° C. for half to two hours prior to the final cold rolling process. In this invention of copper alloy for the thermally stable tin/lead coating at elevated temperature uses, it is particularly important to apply tension-annealing heat treatment at a temperature between about 300° to 600° C. from 5 to 30 minutes. The application of slight tension force in the tension-annealing treatment also improves the flatness of the copper sheet. Instead of tensionannealing treatment as described above, mechanical tension levelling treatment can also be used after the final cold rolling process and improve the flatness of the cold rolling process to reduce the residual stress induced during the cold rolled sheet of the final product having thickness about 3 mm for applications as semiconductor leadframe material.

EXAMPLE 1

Alloys having compositions of Table 1 were melted, and then cast by rapid cooling. The ingots were hot rolled at 950° C., so that it had a thickness of about 8 mm, and the plates were rapidly cooled, the hot rolled and rapidly cooled palates were cold rolled with a thickness of about 2 mm. The cold rolled sheets were annealed at a temperature of about 480° C., and they were annealed at a temperature of 500° C., and further cold rolled to a thickness to 0.3 mm thickness. And then, the cold rolled sheets were subjected to a tension annealing treatment at a temperature of about 550° C., with a travelling speed of 1 m/min in the annealing furnace. Mechanical properties and electrical conductivities of each alloy are given in Table 2.

TABLE 1

| | Alloy | chemical composition (weight percent) | | | | | | |
| --- | --- | --- | --- | --- | --- | --- | --- | --- |
| | | Ni | Si | P | Mg | Zn | Fe | Cu |
| this invention | 1 | 1.5 | 0.3 | 0.03 | 0.05 | | | balanced |
| | 2 | 1.5 | 0.3 | 0.03 | 0.13 | | | " |
| | 3 | 2.3 | 0.4 | 0.12 | 0.10 | | | " |
| | 4 | 0.6 | 0.1 | 0.02 | 0.03 | | | " |
| | 5 | 1.0 | 0.2 | 0.15 | 0.07 | 0.8 | | " |
| | 6 | 0.8 | 0.2 | 0.03 | 0.05 | 0.5 | 0.8 | " |
| prior art | 7 | 1.5 | 0.3 | 0.03 | | | | " |
| | 8 | 1.0 | 0.2 | 0.03 | | | | " |

TABLE 2

| | Alloy | tensile strength (ki/ml) | elongation (%) | electrical conductivity (% IACS) |
| --- | --- | --- | --- | --- |
| this invention | 1 | 70 | 10 | 60 |
| | 2 | 76 | 8 | 59 |
| | 3 | 78 | 8 | 57 |
| | 4 | 57 | 15 | 60 |
| | 5 | 60 | 10 | 58 |
| | 6 | 60 | 8 | 55 |
| prior art | 7 | 65 | 4 | 60 |
| | 8 | 64 | 6 | 62 |

In order to evaluate thermal softening resistance of this copper alloy invented, tensile tests at room temperature were conducted for the Alloy 2 of Table 1 after heating one hour at 250° C., 350° C., 400° C., 450° C., 500° C., 550° C., and air cooling to room temperature. The Alloy 2 of Table 1 for testing was tension annealed at 550° C. prior to subjecting this heat treatment for thermal softening tests. The results for this Alloy 2 are compared with those of the U.S. Pat. No. 4,446,939 and CDA 19400 as in the FIG. 1. In this invention, the strength of alloys increased by 15%, and thermal softening resistance temperature is gained more than 100° C. compared to that of prior art. The superior thermal softening resistance of this invention makes the Bare Bondability easier.

In addition to the superior strength, this invention possesses good formability due to greater elongation, and shows good fatigue fracture resistance compared to those of the prior art. Therefore, this invention can also be used for electrical and electronic parts like connectors.

EXAMPLE 2

In order to measure the thermal stability of tin/lead plating, the cold rolled and tension annealed sheets having 0.3mm thickness were electroplated with a 80tin/20lead with a thickness of 0.01 mm. The electroplated sheets were heated to 145° C. for varying time up to 120 hours, and the heated sheets were bent into 90 degree with a radius of about 0.25 mm. The outer surfaces of tin/lead coating at the bent area were examined by scanning electron microscopy to check cracking caused by the formation of brittle intermetallic compounds. Results after the burn-in tests with varying time for each alloy are presented in Table 3.

TABLE 3

| | Alloy | heating hours at 145° C. | existance of crack |
| --- | --- | --- | --- |
| this invention | 1 | 120 | none |
| | 2 | 120 | none |
| | 3 | 88 | none |
| | 4 | 72 | none |
| | 5 | 96 | none |
| | 6 | 72 | none |
| prior art | 7 | 48 | yes |
| | 8 | 48 | yes |

Figure 2:
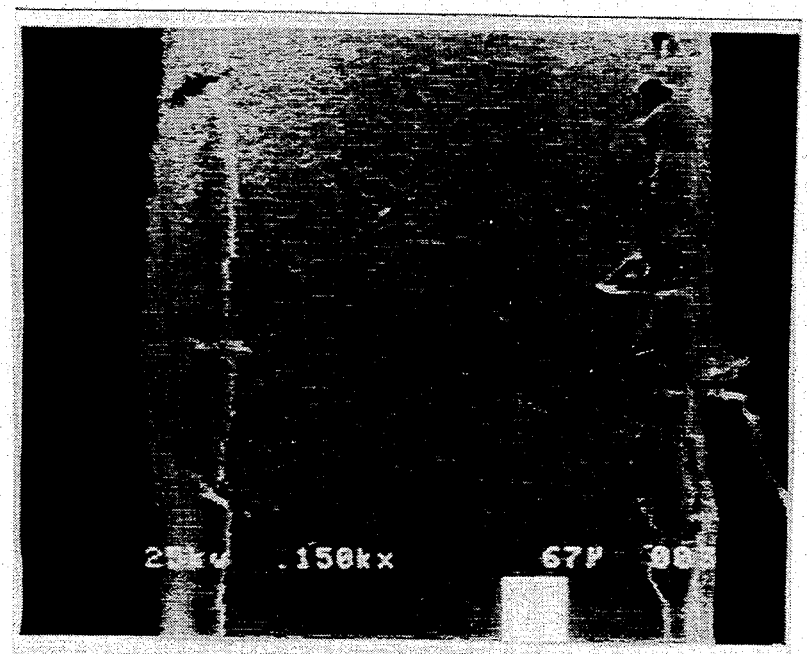
FIG. 2 is the scanning electron micrograph showing bending experiment of tin-lead plated conventional alloys.

As in tables, the alloy of the U.S. Pat. No. 4,466,939 experienced cracking of the tin/lead coating after heating at 145° C. for 48 hours as in a scanning electron micrograph of FIG. 2.

Figure 3:
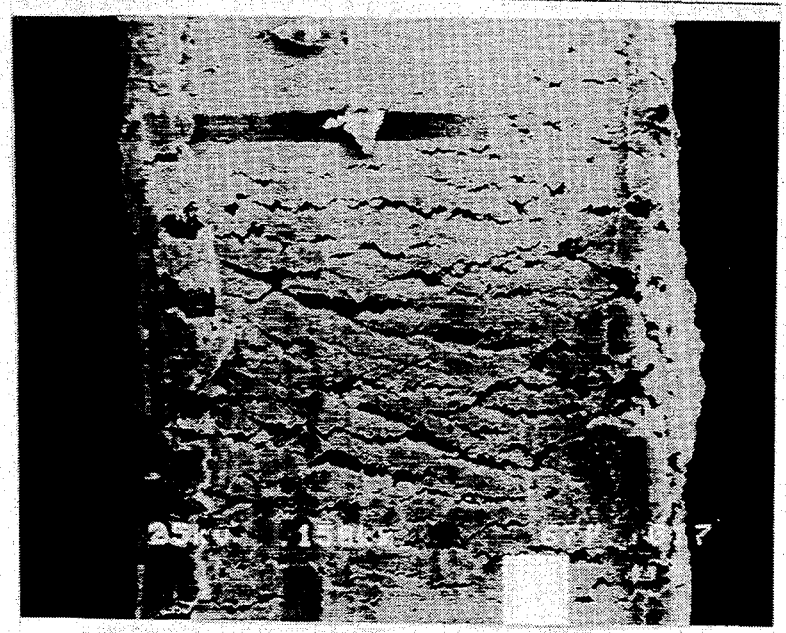
FIG. 3 is the scanning electron micrograph showing bending experiment of another tin-lead plated conventional alloy(CDA 19400)
Figure 4:
FIG. 4 is the scanning electron micrograph showing bending experiment of this tin-lead plated alloy invented.

FIG. 3 is the scanning electron micrograph of tin/lead plated CDA 19400 which showed severe cracks tin/lead coating exposure at 145° C. for 72 hours. However, no cracking or peeling off the tin/lead plating on this invention alloy (alloy 1-6) have been observed. Typical microstructure of the stable tin/lead coating on this invention after thermal exposure at 145° C. for 120 hours is shown in a scanning electron micrograph of the FIG. 4. Thus, the alloy of this invention can be used safely at high temperature above 100° C. after tin/lead coating. The alloy of U.S. Pat. No. 4,466,939 or CDA 19400 alloy also showed cracks on Sn/Pb coated strip at 145° C. before 72 hours, so that they cannot be used at elevated temperature. But, the alloy of this invention surely can be used at 145° C. over 100 hours.

The alloys of this invention also exhibited high tensile elongation (8% min) and good electrical conductivity (56% IACS min) with having high strength as in the Table 2. Therefore, this invention can be widely used for the advanced semiconductor leadframe, and high strength electric parts like connectors, which require high strength, high elongation, good electrical (thermal) conductivity, and thermal stability of tin/lead coating.

What is claimed is:

1. A copper alloy having high strength, enhanced ductility, and good electrical conductivity consisting essentially from about 0.5 to 2.4% by weight nickel, from 0.1 to 0.5% by weight silicon, from about 0.02 to 0.16% by weight phosphorus from 0.02 to 0.2% by weight magnesium and balance copper.

2. A semiconductor leadframe comprising the copper alloy according to claim 1.

3. A connector for electric or electronic parts comprising the alloy according to claim 1.

4. An alloy according to to claim 1, wherein about 1 weight percent zinc is added to said alloy.

5. An alloy according to claim 1, wherein below 1 weight percent iron is added to substitute for a portion of nickel.

* * * * *